(12) United States Patent
Houghton et al.

(10) Patent No.: US 6,271,717 B1
(45) Date of Patent: Aug. 7, 2001

(54) BIAS CIRCUIT FOR SERIES CONNECTED DECOUPLING CAPACITORS

(75) Inventors: Russell J. Houghton, Essex Junction; Christopher P. Miller, Underhill, both of VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/694,243

(22) Filed: Oct. 23, 2000

Related U.S. Application Data

(62) Division of application No. 09/303,359, filed on Apr. 29, 1999.

(51) Int. Cl.[7] .................................................. G05F 1/10
(52) U.S. Cl. ........................ 327/538; 327/540; 327/541; 326/63
(58) Field of Search .................................. 327/538, 540, 327/541, 542, 543, 333; 326/62, 63

(56) References Cited

U.S. PATENT DOCUMENTS

| | | | |
|---|---|---|---|
| 4,837,457 | * | 6/1989 | Bergstrom et al. ................... 327/540 |
| 4,929,848 | * | 5/1990 | Gulczynski ........................... 327/540 |
| 5,221,864 | * | 6/1993 | Galbi et al. .......................... 327/537 |
| 5,592,421 | * | 1/1997 | Kaneko et al. ................... 365/189.09 |
| 5,612,613 | * | 3/1997 | Dutt et al. ............................ 323/314 |
| 5,923,212 | * | 7/1999 | Womack .............................. 327/541 |
| 5,949,276 | * | 9/1999 | Chen .................................... 327/541 |

* cited by examiner

*Primary Examiner*—Timothy P. Callahan
*Assistant Examiner*—An T. Luu
(74) *Attorney, Agent, or Firm*—John J. Goodwin

(57) ABSTRACT

A semiconductor circuit for providing decoupling capacitance to an integrated circuit voltage supply that includes a decoupling capacitance comprised of an array of memory cells connected in series at a node and a source of biasing voltage connected to the array of memory cells at the node for maintaining the voltage level at the node lower than the voltage level of the voltage supply.

3 Claims, 3 Drawing Sheets

BIAS CIRCUIT FOR SERIES CONNECTED DECOUPLING CAPACITORS

This application is a divisional application of CO-PENDING application Ser. No. 09/303/359 filed on Apr. 29, 1999.

BACKGROUND OF THE INVENTION

1. Field of the Invention

The present invention relates to power supplies for integrated circuits, and more particularly to decoupling capacitors for high voltage supplies for DRAM circuit arrays.

2. Background Art

U.S. Pat. No. 5,612,613 issued Mar. 18, 1997 to Dutt et al. entitled REFERENCE VOLTAGE GENERATION CIRCUIT discloses a circuit for rectifying and AC input voltage using a composite input voltage derived from the AC input voltage and composed of a scaled AC input voltage shifted by a selected DC bias voltage.

U.S. Pat. No. 5,592,421 issued Jan. 7, 1997 to Kaneko et al. entitled SEMICONDUCTOR INTEGRATED CIRCUIT FOR GENERATING AN INTERNAL POWER SOURCE VOLTAGE WITH REDUCED POTENTIAL CHANGES discloses a circuit device that restricts changes in a power source potential when an externally applied power source potential changes.

U.S. Pat. No. 5,221,864 issued Jun. 22, 1993 to Galbi et al. entitled STABLE VOLTAGE REFERENCE CIRCUIT WITH HIGH VT DEVICES discloses a voltage reference circuit that produces an output offset from a supply voltage, the output being relatively stable regardless of variations in external power supplies.

U.S. Pat. No. 4,929,848 issued May 29, 1990 to Gulezynski entitled HIGH ACCURACY REFERENCE LADDER discloses a reference ladder circuit comprising capacitors coupled in series that produces a plurality of reference signals having high accuracy.

U.S. Pat. No. 4,837,457 issued Jun. 6, 1989 to Bergstrom et al. entitled HIGH VOLTAGE POWER TRANSISTOR CIRCUITS discloses a circuit comprising a pair of transistors serially connected through an inductor to a supply voltage. Other components are connected to the transistors which determine various periods of operation. A phase comparator is included having an output that is used to ensure the required simultaneous non-conduction of the transistors.

SUMMARY OF THE INVENTION

An object of the present invention is to provide an improved dynamic random access memory (DRAM) power supply for integrated circuits.

Another object of the present invention is to provide an improved power supply for integrated circuits including a lower voltage limit capacitor configuration.

Still another object of the present invention is to provide an improved DRAM power supply using series connected array capacitors having lower voltage limits to provide decoupling capacitance to higher operating voltage power supplies.

Other features, advantages and benefits of the present invention will become apparent in the following description taken in conjunction with the following drawings. It is to be understood that the foregoing general description and the following detailed description are exemplary and explanatory but are not to be restrictive of the invention. The accompanying drawings which are incorporated in and constitute a part of this invention and, together with the description, serve to explain the principles of the invention in general terms. Like numerals refer to like parts throughout the disclosure.

DESCRIPTION OF THE INVENTION

High performance DRAM chips require significant amounts of decoupling capacitance to function as charge reservoirs and to minimize ripple, noise, and ringing on critical power supplies. But when DRAM chips are fabricated with increasingly dense process technologies, the area for the circuits, including that for decoupling capacitance, diminishes but the power supply requirements remain substantial. The DRAM array capacitor has been adapted in an attempt to provide extra decoupling capacitance because of the higher effective capacitance per unit area that it provides over a planar FET capacitor of the type shown in FIG. 1.

However, a major drawback of using the array capacitor to provide decoupling capacitance is that lower operation voltage limits are required by array capacitors, and there is a limitation on the types of power supplies that array capacitors can be used on.

Because DRAM memory array capacitors have very thin dielectrics, the voltage limit for DRAM memory capacitors to remain reliable is typically lower than most of the external and internal voltage supplies.

The present invention overcomes this drawback by allowing the use of array capacitors with a low operating voltage limit to provide decoupling capacitance to higher operating voltage supplies of DRAM chips. This is accomplished by connecting the array capacitors in series and providing bias means to bias the series connection node against leakage with minimal standby current, but with a capacity to handle significant defect leakage.

Figure 1:
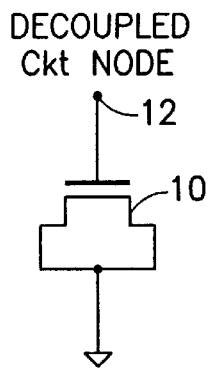
FIG. 1 is a schematic illustration showing a planer MOS decoupling capacitor according to the prior art.
Figure 2:
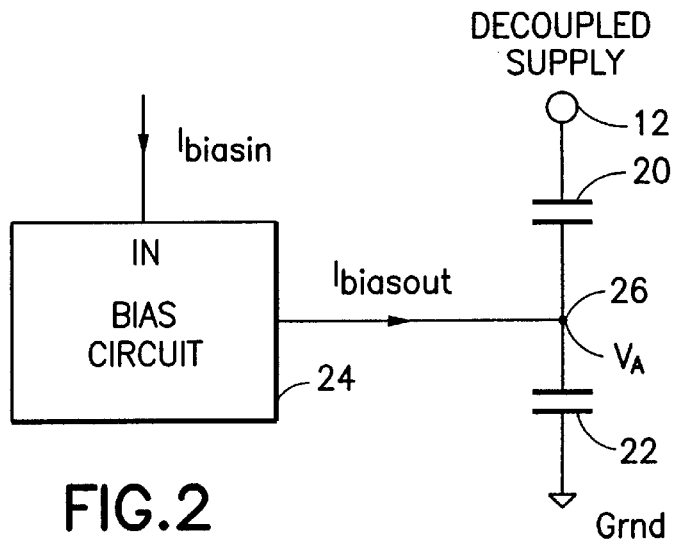
FIG. 2 is a schematic illustration showing a series connected array decoupling capacitor in combination with a bias circuit according to the principles of the present invention.

Referring to FIG. 1, an illustration is provided of a typical prior art planar MOS decoupling capacitor 10 that is normally connected to the decoupled circuit node 12 of a power supply. DRAM memory array capacitors have very high capacitance per unit area so connecting them in series as shown in FIG. 2 wherein capacitors 20 and 22 are connected in series at node 26 provides a useful capacitance per unit area while reducing the voltage across each capacitor to one half what it would be for a single capacitor. Because capacitors can have leakage through the dielectric due to defects, the common node 26 of capacitors 20 and 22 is not guaranteed to remain near one half of the total voltage across the series connected capacitors 20 and 22.

FIG. 2 illustrates a decoupling capacitance means according to the present invention wherein the series connected array capacitors 20 and 22 are connected between the decoupled circuit node 12 and ground. The term array capacitor as used herein is one of an array of capacitive storage elements in a memory such as a DRAM that is characterized by having a small size and a thin dielectric.

In FIG. 2, the DRAM memory array capacitors 20 and 22 are connected in series and, in order to permit them to be used for decoupling on higher value voltage supplies, a bias circuit 24 is provided to maintain a safe voltage across each capacitor even when a capacitor defect is present. If a defect in a series connected decoupling capacitor is present, the bias circuit must supply enough current to maintain safe voltages across all capacitors in a series connected decoupling capacitor array up to a level where the supplied current is high enough to fail a manufacturing DC specification and be screened out during testing.

Referring to FIG. 2, a bias circuit 24 is connected to node 26 between the array capacitors 20 and 22. Bias circuit 24 provides a bias voltage source having a level to maintain the average value of the voltage $V_A$ at the series connected node 26 to nearly one half of the magnitude of the applied power supply at node 12 in order to insure that the maximum voltage across either array capacitor 20 or 22 does not exceed that maximum voltage specification of the capacitor. Bias circuit 24 may be powered from the decoupled circuit node. Thus the bias circuit 24 can limit the voltage of either capacitor 20 or 22 to less than the damage voltage when one of the capacitors has defect leakage current.

Although FIG. 2 shows two capacitors 20 and 22 connected in series, more than two capacitors connected in series can be used in the circuit. In most applications it is not area efficient or practical to use a single bias circuit for each individual pair of series connected decoupling capacitors. It is also undesirable to use a single bias circuit for all the pairs of series connected decoupling capacitors since this could allow a single large defect in one capacitor to affect the bias voltage on all the series connected capacitors and also would require a separate bias wire to be run globally throughout an integrated circuit.

Figure 3:
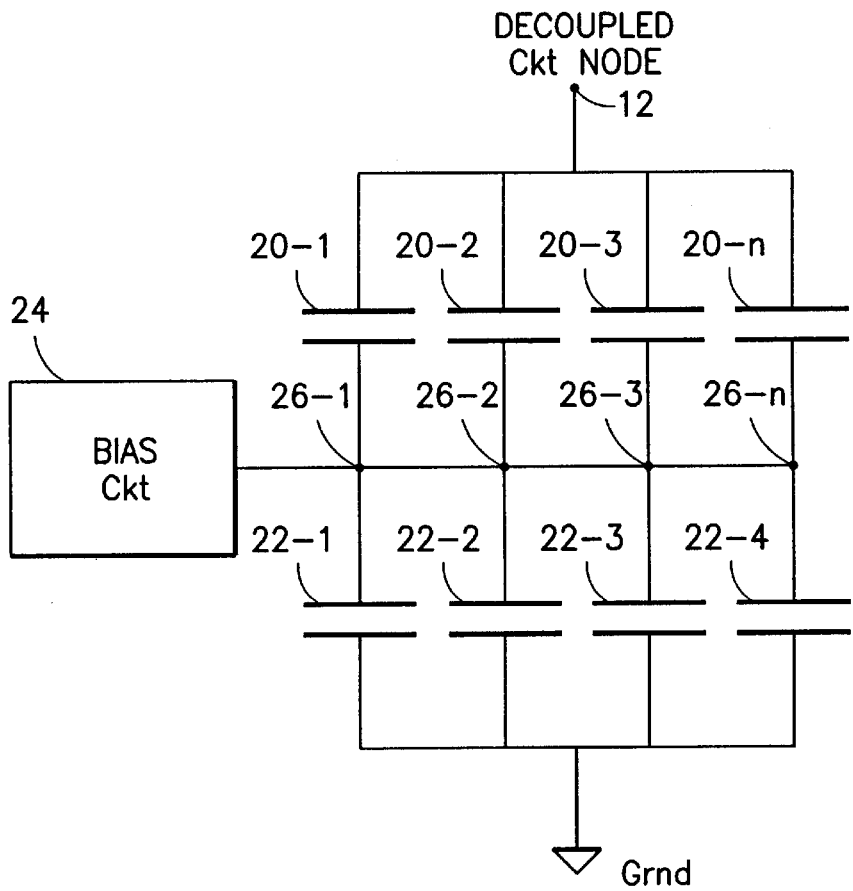
FIG. 3 is a schematic illustration showing a series connected array decoupling capacitor group in combination with a bias circuit according to the principles of the present invention.

Thus, it is preferred to use a bias circuit for a group of series connected decoupling capacitors and a typical integrated circuit can have many individual groups of series decoupling capacitors distributed throughout the integrated circuit. FIG. 3 shows embodiment of the present invention with bias circuit 24 connected to a group of series connected capacitors.

For a group of series connected decoupling capacitors to be placed and wired as easily as non-series connected decoupling capacitors and not require separate power supplies, it is necessary for the bias circuit to be powered from the decoupled power supply. For a bias circuit to be powered from the decoupled power supply, the quiescent current $I_{(biasin)}$ drawn from the decoupled power supply by a single bias circuit must be very low such that the number of instances of bias circuits times the quiescent current of each circuit is an insignificant contributor to the total standby current of the semiconductor chip.

Also, the peak transient voltage swing of the decoupled power supply cannot cause the bias circuit to sink or source current at its output or to cause current drain from the decoupled voltage supply. Furthermore, the maximum average voltage of the decoupled supply during normal operation or testing cannot cause the bias circuit to draw current from the decoupled power supply and the bias circuit must sink and source a DC current $I_{limit}$ while maintaining a safe maximum voltage (less than a breakdown voltage, $V_{bk}$) across either capacitor connected in series.

In the discussion of the present invention with respect to FIGS. 2, 4, 5, 6 and 7, particular voltages and currents will be referred to by subscripts. Such voltages and currents are $V_A$ which is the voltage at node 26 in FIG. 2, $V_{Anom}$ which is the average or DC voltage of the node 26.

$V_{supply\ nom}$ is the average or DC voltage of the power supply, such as at node 12 in FIG. 2, being decoupled by the series connected capacitors. $V_{peak}$ is the maximum positive or negative transient voltage excursion of the decoupled power supply, $V_{Amin}$ is the minimum voltage that node 26 reaches when the most negative noise peak occurs on the decoupled power supply and $V_{Amax}$ is the maximum voltage that node 26 reaches when the most positive noise peak occurs on the decoupled power supply.

$I_{biasin}$ is the current drawn by the bias circuit from the supply that powers it, which may or may not be the decoupled supply. $I_{biasout}$ is the current supplied by the bias circuit to the bias node 26 of the series connected capacitors. $V_{BVc1}$ and $V_{BVc2}$ are the breakdown voltages of the series connected capacitors such as capacitors 20 and 22 in FIG. 2, and $I_{limit}$ is the predefined positive or negative test current limit.

Figure 6:
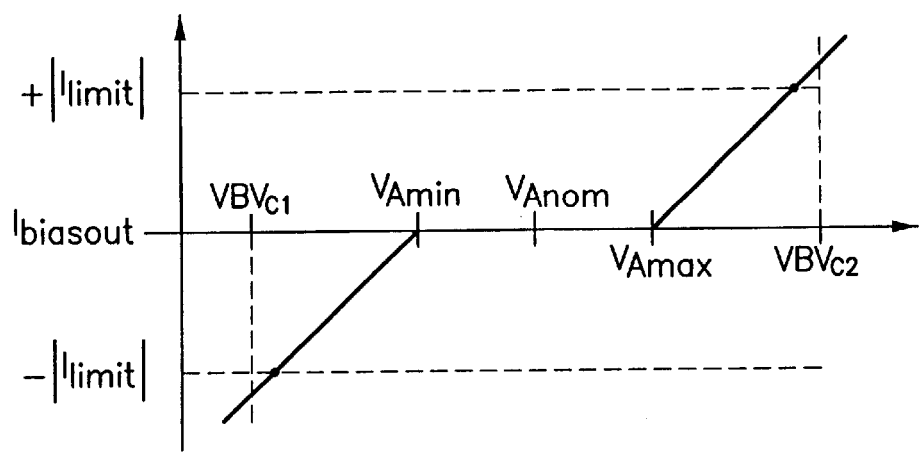

For a bias circuit to meet the requirements set forth above, it must meet the following criteria: The circuit operating current drain, Ibiasin, must be significantly less than the standby current drawn from other circuits and leakage on the semiconductor chip. Additionally, as illustrated in FIG. 6, the current $I_{biasout}$ at the output when the voltage across either capacitor is greater than or equal to the breakdown voltage $V_{BVc2}$ or $V_{BVc1}$ must be greater than predefined absolute test current limits $+[I_{limit}]$ or $-[I_{limit}]$ respectively as shown.

Figure 5:
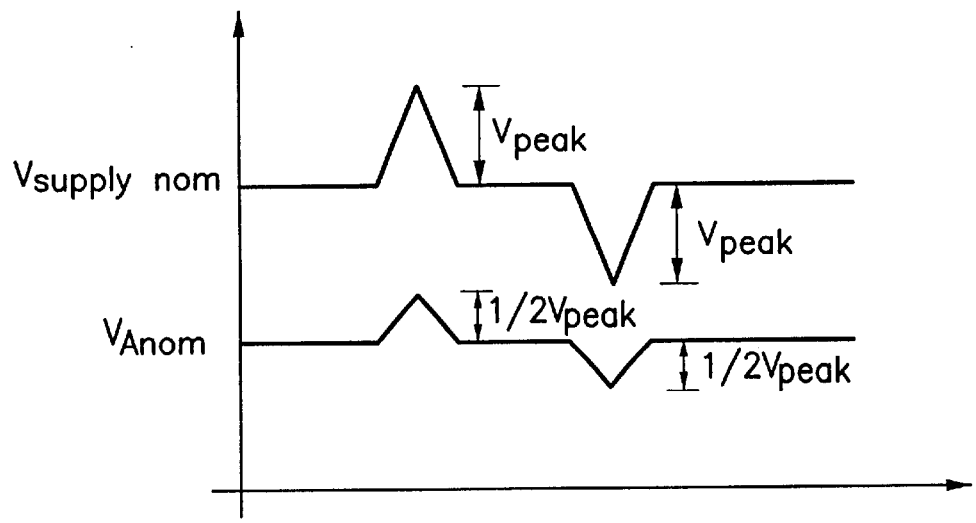
FIGS. 5, 6 and 7 are curves illustrating the relationships of bias currents and the voltages at nodes 12 and 26 FIGS. 2 and 3.

Transient current loading on the decoupled circuit node produces voltage variations on the circuit node well known in the art as noise. This noise is represented in FIG. 5 by positive and negative voltage excursions $V_{peak}$ about an average voltage $V_{supply\ nom}$ as shown. Capacitors 20 and 22 in FIG. 2 form a capacitor divider ratio of ½. Therefore, the noise at node 26 will be ½ of the noise on the decoupled circuit node and will have an average value $V_{Anom}$ as shown. A further requirement of the bias circuit is that no additional chip current should be consumed as a result of noise on node 26 being applied to the bias circuit output. To meet this requirement the bias circuit output current $I_{biasout}$ must be substantially zero over the voltage range $V_{Amin}$ and $V_{Amax}$ as shown in FIG. 6 where $V_{Amin}$ is less than or equal to $V_{Anom}$ $-½\ V_{peak}$, and $V_{Amax}$ is greater than or equal to $V_{Anom}$ $+½\ V_{peak}$.

A significant feature of the invention is that the bias circuit 24 has a very low standby current consumption, typically on the order of 5 nanoAmperes nominally and less than 25 nanoAmperes for the worst case conditions of short channel lengths and low device threshold voltages. This feature allows the use of many applications of bias circuits on a chip with individual groups of decoupling capacitors without adding significantly to the over-all chip standby current. For example, one hundred of such circuits on a chip would add only 2.5 mircoAmperes to the total standby current.

The ability to include many such described circuits on a chip eliminates the need to bus a single wire bias around the chip and also removes the possibility of a single catastrophic defect disabling the bias for all such series connected capacitors at once and causing undesired over stress of the low voltage limited capacitors.

Alternatively, the bias circuits may be interconnected to provide higher total defect current tolerance.

Another feature of the bias circuit is that it maintains a region of low current so that AC coupling into the common node of a group of series connected capacitors does not lead to current drawn by the bias circuit.

A third feature of the bias circuit is that on either side of the flat low current region, current is progressively sourced or sinked such that the bias circuit will provide significant current (Ibiasout)to handle defects while maintaining a sufficient bias voltage to avoid over stress of the capacitors or to allow a large enough current to be supplied such that the device can be rejected with a DC screen. Furthermore, with the circuit 24 of FIG. 2 there is no current sourced/sinked at the series connection node 26 during transient voltage excursions.

Referring to FIG. 3, an embodiment of the present invention is shown wherein bias circuit 24 is connected to a plurality of series connected array decoupling capacitors 20-1, 20-2, 20-3 . . . 20-n and 22-1, 22-2, 22-3 . . . 22-n at nodes 26-1, 26-2, 26-3 . . . 26-n that provide a distributed capacitive decoupling to be placed in open areas distributed throughout the peripheral circuit regions of a chip with better capacitance per unit area than a planar FET capacitor, without extra global biasing, and with characteristics equivalent to capacitors which are not series connected. Since, as previously stated, the bias circuit can limit the voltage of the capacitors to less than the damage voltage when a capacitor has defect leakage current, a defect of one of the capacitors in the group does not affect the other groups.

Figure 4:
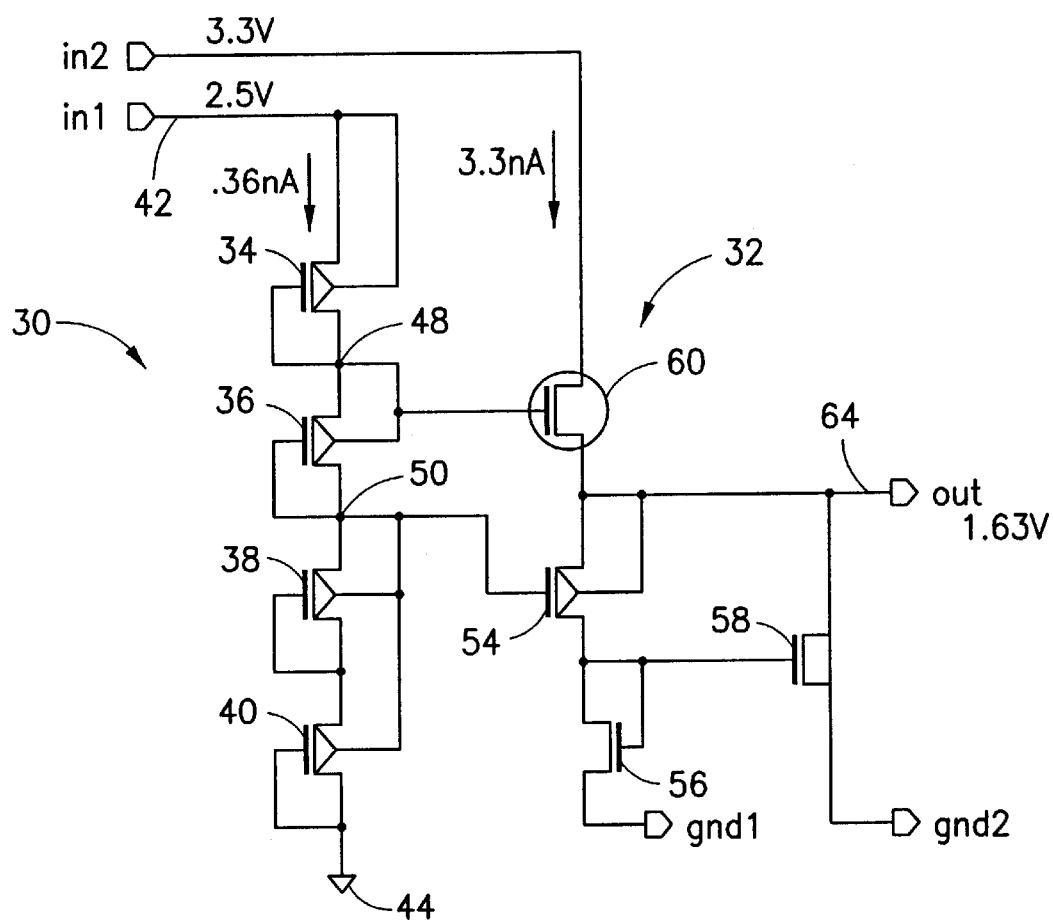
FIG. 4 is a schematic illustration showing a bias circuit for a series connected array decoupling capacitor group according to the principles of the present invention.

Referring to FIG. 4, a schematic illustration of an embodiment of the bias circuit 24 is shown. The bias circuit is composed of two main stages 30 and 32. The first stage 30 is a reference generation stage that includes P type transistors 34, 36, 38 and 40 connected in series between a first input lead 42 at a $V_{in1}$ of 2.5 volts and ground 44. Transistors 34, 36, 38 and 40 comprise a voltage divider circuit operating in the sub-threshold region of conduction, typically drawing 0.36 nAmps. In the particular embodiment of FIG. 4, all the transistors in the circuit are biased the same. Depending on the tap chosen, the output voltage from the voltage divider stage is $V_{in1}/4$, $2(V_{in1}/4)$, or $3(V_{in1}/4)$. The well bias of transistor 40 is changed to slightly raise the threshold voltage of transistor 40 which thereby slightly raises the voltage levels at nodes 48 and 50. With $V_{in1}$ at 2.5 volts, the voltage at node 48 is approximately 1.9 volts and the voltage at node 50 is approximately 1.3 volts. These voltages at node 48 and 50 are reference voltages which set the $V_{Amin}$ and $V_{Amax}$ voltage points for the bias circuit characteristic.

P type transistor 54 and N type transistors 56, 58, and 60 in stage 32 comprise the current drive transistors. Transistor 60 operates nominally in subthreshold with transistor 54 such that the gate to source voltage of transistor 60 ($V_{gs}60$) plus the gate to source voltage of transistor 54 ($V_{gs}54$) is equal to $V_{in1}/4$ which is 2.5 volts/4=0.625 volts.

$V_{out}$, the bias voltage on output lead 64, is roughly divided across both transistors and in between the voltages at nodes 48 and 50 (1.6 volts). The size of transistor 60 determines I–V characteristic as current is taken from the output lead 64, pulling the source of transistor 60 below its equilibrium voltage. Transistor 58 is in a 4:1 current mirror configuration with transistor 56. The sizes of transistors 56 and 58 determine the I–V characteristic of the output as current is added to output lead 64 and raises the source of transistor 54 above its equilibrium voltage.

Referring to FIG. 5, curves of the voltage $V_{supply\ nom}$ at the decoupled circuit voltage supply node 12 and the voltage $V_{Anom}$ at node 26 are shown with the plus and minus $V_{supply\ nom}$ peaks and corresponding values at node 26 of plus and minus ½ $V_{supply\ nom}$ peaks.

FIG. 6 illustrates the relationships between the output bias current $I_{biasout}$ on bias circuit output lead 64 vs. the minimum, nominal and maximum values of the voltage at bias circuit node 26 and the voltage at capacitors 20 and 22.

Figure 7:
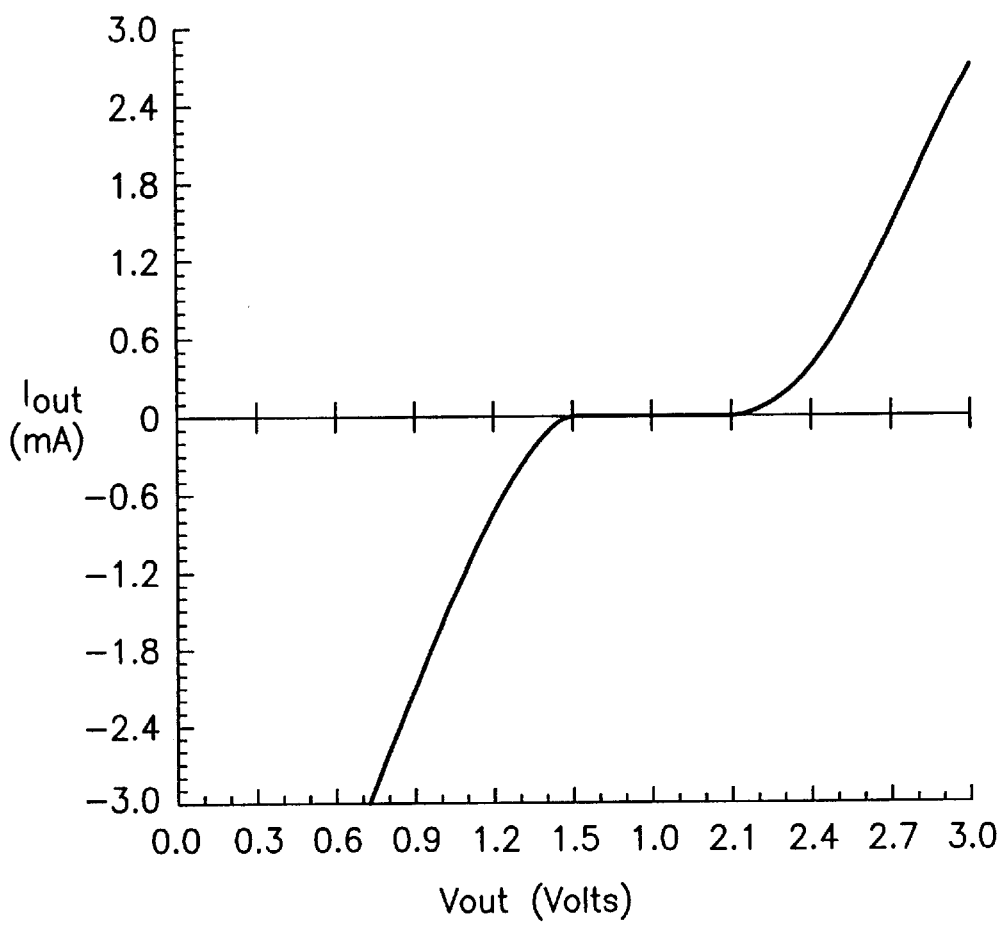

Referring to FIG. 7, a curve of the output bias current vs. the ouutput voltage characteristic of the bias circuit of FIG. 4 is illustrated.

What has been described is a bias circuit that primarily provides a desired current-voltage I–V curve with minimum parasitic current rather than to maintain a specific voltage with high accuracy or independent of bias control.

The advantage of a bias circuit according to the present invention is that it can be made very small and thus adds very little area overhead to the group of series connected decoupling capacitors. Even with the overhead of a bias circuit and special boundary dummy shapes, a 184 pF series connected capacitor structure has an area of 16560 um2 to yield a real 11.1 fF/um2 capacitance per unit area. By comparison, the theoretical maximum capacitance of a planar FET capacitor in the same technology is 4.6 fF/um2 and an actual planar FET with an area of 12370 um2 has a 38 pF capacitance to yield only 3.07 fF/um2 and is therefore nearly ⅓ less efficient.

While the invention has been described in connection with a preferred embodiment, it is not intended to limit the scope of the invention to the particular form set forth, but on the contrary, it is intended to cover such alternatives, modifications and equivalence as may be included within the spirit and scope of the invention as defined in the appended claims.

What is claimed is:

1. A bias circuit for providing a selected bias voltage level comprising:

a first transistor circuit path for providing a reference generation voltage, the first transistor circuit path being connected to a first input lead at a first voltage level and including a plurality of series connected transistors;

a second transistor circuit path connected to a second input lead at a second voltage level and including a plurality of series connected bias transistors;

an output lead connected between first and second ones of the series connected bias transistors of the second transistor circuit path for providing an output bias voltage; and a transistor connected to the output lead and between the second and a third one of the series connected bias transistors of the second transistor circuit path, wherein the first and second series connected bias transistors of the second transistor circuit path are connected to voltage taps between the series connected transistors of the first transistor circuit path.

2. A bias circuit according to claim 1 wherein the first transistor circuit path includes first, second, third and fourth P type transistors connected in series and the second transistor circuit path includes a first N type bias transistor, a second P type bias transistor and a third N type bias transistors connected in series.

3. A bias circuit according to claim 2 wherein the first N type bias transistor of the second transistor circuit path has a gate connected to a voltage tap between the first and second P type transistors of the first transistor circuit path, and wherein the second P type bias transistor of the second transistor circuit path has a gate connected to a voltage tap between the second and third P type transistors of the first transistor circuit path.

* * * * *